(12) United States Patent  (10) Patent No.: US 7,307,474 B2
Nguyen  (45) Date of Patent: Dec. 11, 2007

(54) INTEGRATED BOOSTER AMPLIFIER (75) Inventor: Tranh T. Nguyen, Rohnert Park, CA (US)

(73) Assignee: NPhysics, Inc., Milpitas, CA (US)

( * ) Notice: Subject to any disclaimer, the term of this patent is extended or adjusted under 35 U.S.C. 154(b) by 0 days.

(21) Appl. No.: 11/316,469

(22) Filed: Dec. 21, 2005

(65) Prior Publication Data

US 2006/0132234 A1 Jun. 22, 2006

Related U.S. Application Data

(60) Provisional application No. 60/723,495, filed on Oct. 3, 2005, provisional application No. 60/638,884, filed on Dec. 21, 2004.

(51) Int. Cl.
*H03F 21/00* (2006.01)
(52) U.S. Cl. .................. 330/207 A; 330/146; 330/251
(58) Field of Classification Search ................ 330/146, 330/207 A, 251; 363/41
See application file for complete search history.

(56) References Cited

U.S. PATENT DOCUMENTS 6,388,514 B1   5/2002   King et al.
6,985,034 B1 *  1/2006   Prokin et al. ........... 330/207 A

* cited by examiner

*Primary Examiner*—Khanh Van Nguyen
(74) *Attorney, Agent, or Firm*—Kokka & Backus, PC (57) ABSTRACT

An amplifier is provided. The amplifier comprises an H-bridge with two halves. A capacitor and two inductors are coupled to the H-bridge. Each inductor, a half of the H-bridge, and the capacitor are configured as a boost converter.

3 Claims, 8 Drawing Sheets

INTEGRATED BOOSTER AMPLIFIER

CROSS-REFERENCES TO RELATED APPLICATIONS

This application claims the benefit of U.S. Provisional Application No. 60/638,884, filed Dec. 21, 2004, and U.S. Provisional Application No. 60/723,495, filed Oct. 3, 2005.

FIELD OF THE INVENTION

The present invention relates to amplifiers and, more particularly, to integrated booster amplifiers.

BACKGROUND

Figure 1:
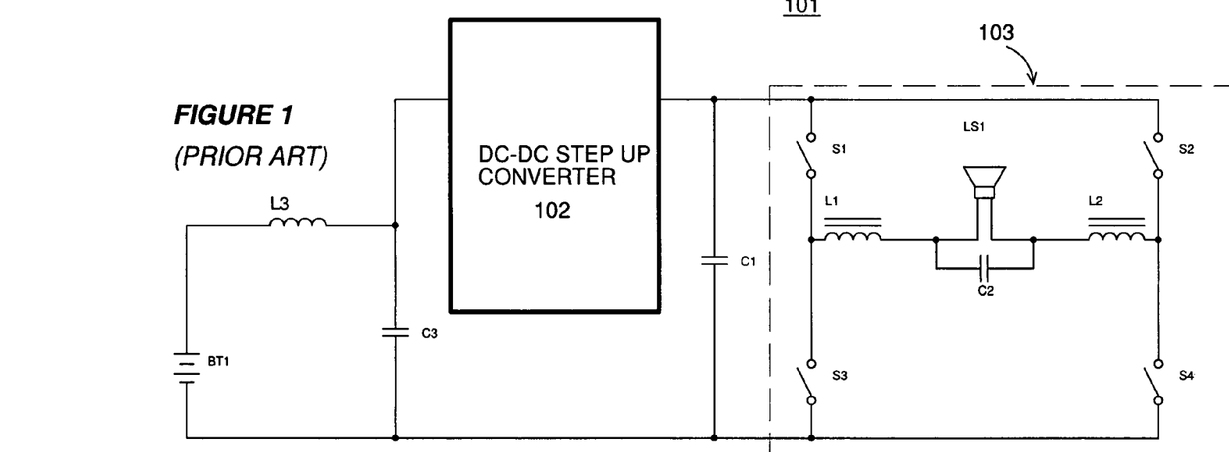
FIG. 1 is a schematic diagram of a conventional amplifier.

FIG. 1 is a schematic diagram of a conventional amplifier designed to provide high power while operating off a low power source voltage. Amplifier 101 includes a direct current (DC)-DC step-up converter 102 coupled to H-bridge 103. In general, direct current DC-DC step-up converters, such as converter 102, are expensive and bulky because the DC-DC step-up converter requires a large capacitor. For example, DC-DC step-up converter 102 can be more expensive than H-bridge 103.

As a result, there is a need for an inexpensive amplifier that is capable of high power levels operating off a low power source voltage.

BRIEF DESCRIPTION OF THE DRAWINGS

The present invention will be readily understood by the following detailed description in conjunction with the accompanying drawings, and like reference numerals designate like structural elements.

DETAILED DESCRIPTION

The invention can be implemented in numerous ways, including as a system, a process, or an apparatus. In general, the steps of disclosed processes may be performed in an arbitrary order, unless otherwise provided in the claims.

A detailed description of one or more embodiments is provided below along with accompanying figures. The detailed description is provided in connection with such embodiments, but is not limited to any particular example. The scope is limited only by the claims and numerous alternatives, modifications, and equivalents are encompassed. Numerous specific details are set forth in the following description in order to provide a thorough understanding. These details are provided for the purpose of example and the described techniques may be practiced according to the claims without some or all of these specific details. For the purpose of clarity, technical material that is known in the technical fields related to the embodiments has not been described in detail to avoid unnecessarily obscuring the description.

The embodiments described herein provide amplifiers and inverters with one or more embedded boost converters. In general, as will be explained in more detail below, the combination of inductors, switches, and capacitors forms the boost converters embedded in the amplifiers and inverters.

Figure 2:
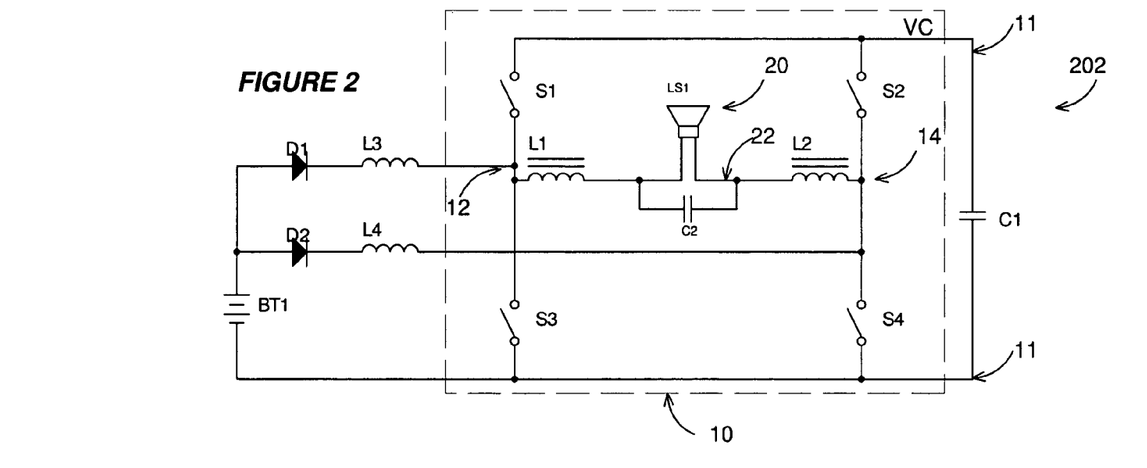
FIG. 2 is a schematic diagram of an exemplary amplifier.

FIG. 2 is a schematic diagram of an exemplary amplifier. As shown in FIG. 2, amplifier 202 includes H-bridge 10 with switches S1-S4, capacitor C1, inductors L3 and L4, one-way valves D1 and D2 (e.g., Schottky rectifiers, ultra-fast recovery diodes, silicon carbide diodes, and other one-way valves), and power source BT1. Inductors L3 and L4 are coupled to H-bridge 10 and capacitor C1 is coupled between rails 11 associated with the H-bridge. H-bridge 10 with switches S1-S4, which may be bi-directional switches, operates off voltage VC of capacitor C1 to drive an alternating current (AC) load 20, such as loudspeaker LS1 and reconstruction filter associated with the loudspeaker that includes inductors L1 and L2 and capacitor C2. In one embodiment, inductors L3 and L4 are coupled to switching nodes 12 and 14, respectively, and power source BT1. Switching node 12 associated with H-bridge 10 is located between switches S1 and S3 and switching node 14 is located between switches S2 and S4. In another embodiment, inductors L3 and L4 may be configured as a coupled inductor that is coupled to switching nodes 12 and 14 and power source BT1.

Diametrically opposed switches, such as S1 and S4 or S3 and S2, associated with H-bridge 10 can be synchronous. In other words, a first set of diametrically opposed switches may be turned on or turned off at the same time, while a second set of diametrically opposed switches are the logical complementary of the first set of diametrically opposed switches. For example, diametrically opposed switches S1 and S4 may be turned on while diametrically opposed switches S2 and S3 are turned off. It should be appreciated that a modulator (not shown) controls the operation of switches S1-S4 based on an audio signal. Alternatively, H-bridge 10 may be driven with class BD modulation. The combination of one inductor L3 or L4, half an H-bridge 10 with switches S1 and S3 or S2 and S4, and capacitor C1 forms a boost converter. Therefore, inductor L3, half of H-bridge 10 or switches S1 and S3, and capacitor C1 are configured as one boost converter. Inductor L4, another half of H-bridge 10 or switches S2 and S4, and capacitor C1 are configured as another boost converter.

As a result, two boost converters are integrated or embedded into amplifier 202. For example, amplifier 202 includes a first boost converter L3, S1, S3, and C1 and additionally includes a second boost converter L4, S2, S4, and C1. The two boost converters act to supply capacitor C1 with voltage VC that is about double the voltage of power source BT1, while switches S1-S4 associated with the two boost converters also serve as H-bridge 10 of a switch-mode amplifier, which may also be known as a class-D amplifier. As used herein, the term "about" means that the specified parameter may be varied within an acceptable tolerance for a given application. In one embodiment, the acceptable tolerance is ±10%. The integration of three distinct power converters, namely two boost converters L3, S1, S3, and C1 and L4, S2, S4, and C1 and switch-mode amplifier, is made possible by the nature of zero average value of an AC signal, such as a sine wave or an audio signal. While the duty cycle of switches S1-S4 are variable according to the amplitude of the AC signal, the average value of the AC signal is about 50%. The average voltage VC on capacitor C1 therefore is about twice the voltage of power source BT1.

In one embodiment, amplifier 202 may additionally include one-way valves D1 and D2 that are coupled in series to inductors L3 and L4, respectively. One-way valves D1 and D2 may be included to prevent reverse inductor currents in inductors L3 and L4, respectively, from discharging capacitor C1. Specifically, one-way valves D1 and D2 are to prevent a reverse inductor current in the case of a low audio frequency that can cause the average inductor voltage to be negative for a period, thereby resulting in the discharge of capacitor C1.

Still referring to FIG. 2, it should be appreciated that amplifier 202 may be used to drive single voice-coil loudspeakers, such as loudspeaker LS1, or any suitable loudspeaker variations through by way of two output terminals 22. Furthermore, no direct current (DC) flows through loudspeaker LS1 and any suitable reconstruction filter L1, L2, and C2 may be used with the loudspeaker. To minimize distortion, a feedback can additionally be taken from two output terminals 22. The design of inductors L3 and L4 is independent of loudspeaker LS1. Accordingly, any suitable level of high-frequency attenuation and optimization can be achieved without compromising audio performance. For example, reconstruction filter L1, L2, and C2 can be designed for a certain bandwidth, such as twenty KHz, and a certain characteristic impedance, such as eight ohms. On the other hand, inductors L3 and L4 may be designed for maximum attenuation of electromagnetic interference (EMI), therefore requiring as low a bandwidth as possible, such as 200 Hz. Further, as DC current flows through inductors L3 and L4, the DC winding resistances of the inductors can be made low such as to minimize heat dissipation.

Figures 3A, 3B, 3C:
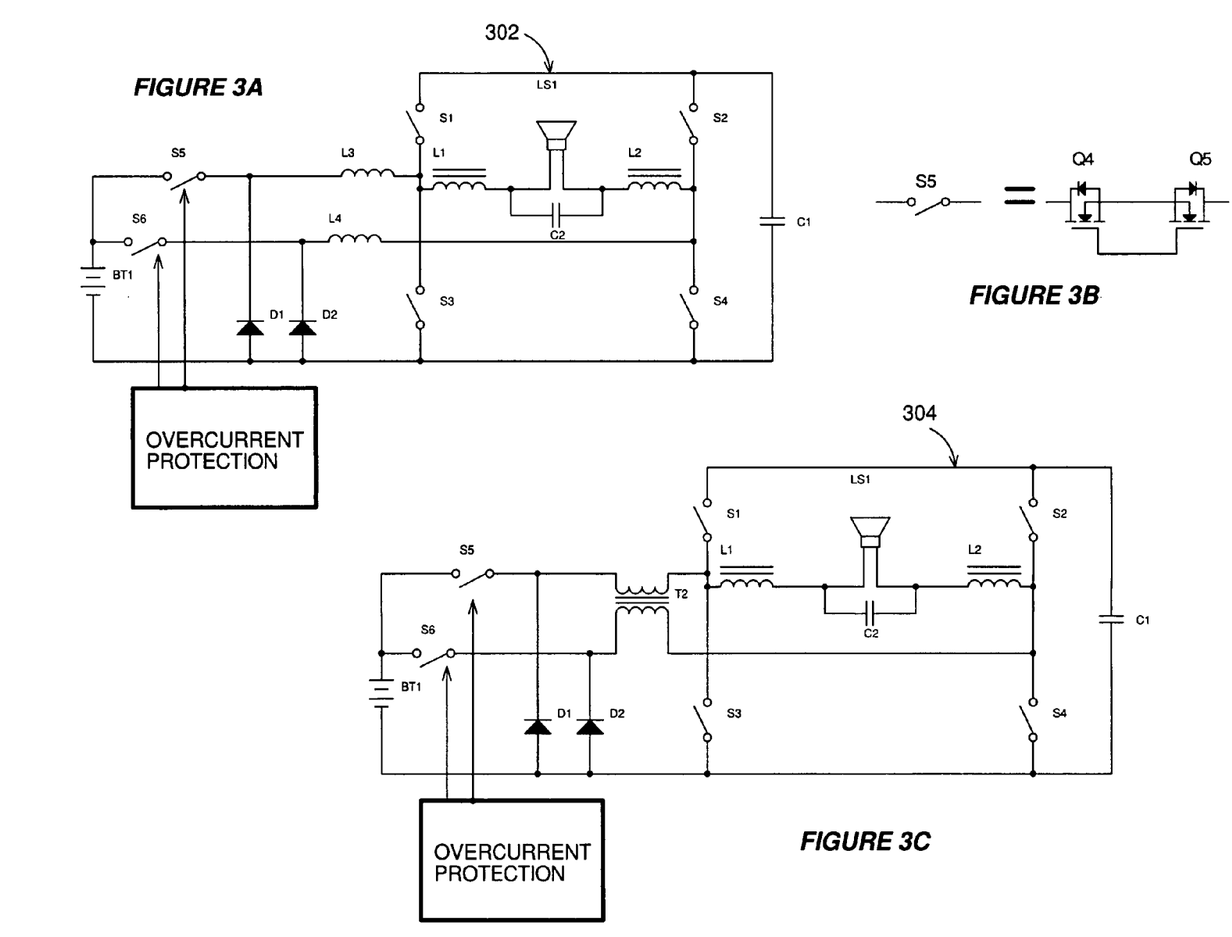
FIG. 3A is a schematic diagram of an exemplary amplifier with over-current protection.
FIG. 3B is a schematic diagram of metal oxide semiconductor field-effect transistors.
FIG. 3C is a schematic diagram of another exemplary amplifier with over-current protection.

FIG. 3A is a schematic diagram of an exemplary amplifier with over-current protection. Amplifier 302 of FIG. 3A is essentially the amplifier of FIG. 2 with additional switches S5 and S6 coupled to power source BT1 and inductors L3 and L4. Since currents in one-way switches D1 and D2 may be substantial, in one embodiment, as shown in FIG. 3A, switches S5 and S6, which may be uni-directional or bi-directional, may be turned off to prevent a negative current in inductors L3 and L4. In another embodiment, switches S5 and S6 can be pulse-width modulated to limit the average current associated with the switches. Accordingly, switches S5 and S6 may be turned off to prevent a negative current in inductors L3 and L4 or to provide over-current protection. Switches S5 and S6 may be controlled by any suitable controllers. For example, opto-couplers that provide floating gate drive for switches S5 and S6 may be used to control the switches.

It should be appreciated that, as shown in the exemplary embodiment of FIG. 3B, low voltage metal oxide semiconductor field-effect transistors (MOFSETs) Q4 and Q5 may be used in place of a switch, such as S5 or S6. MOFSETs Q4 and Q5 may be used with appropriate gate controls to prevent capacitor C1 of FIG. 3A from discharging currents at higher efficiency and also to provide over-current protection.

FIG. 3C is a schematic diagram of another exemplary amplifier with over-current protection. Amplifier 304 of FIG. 3C is essentially the amplifier of FIG. 3A with coupled inductors T2 in place of two inductors. In this embodiment, two inductors L3 and L4 of FIG. 3A may be combined into coupled inductors T2 of FIG. 3B. Accordingly, as shown in FIG. 3B, amplifier 304 may include coupled inductor T2 in a single magnetic structure instead of two separate inductors.

Figures 3D, 3E:
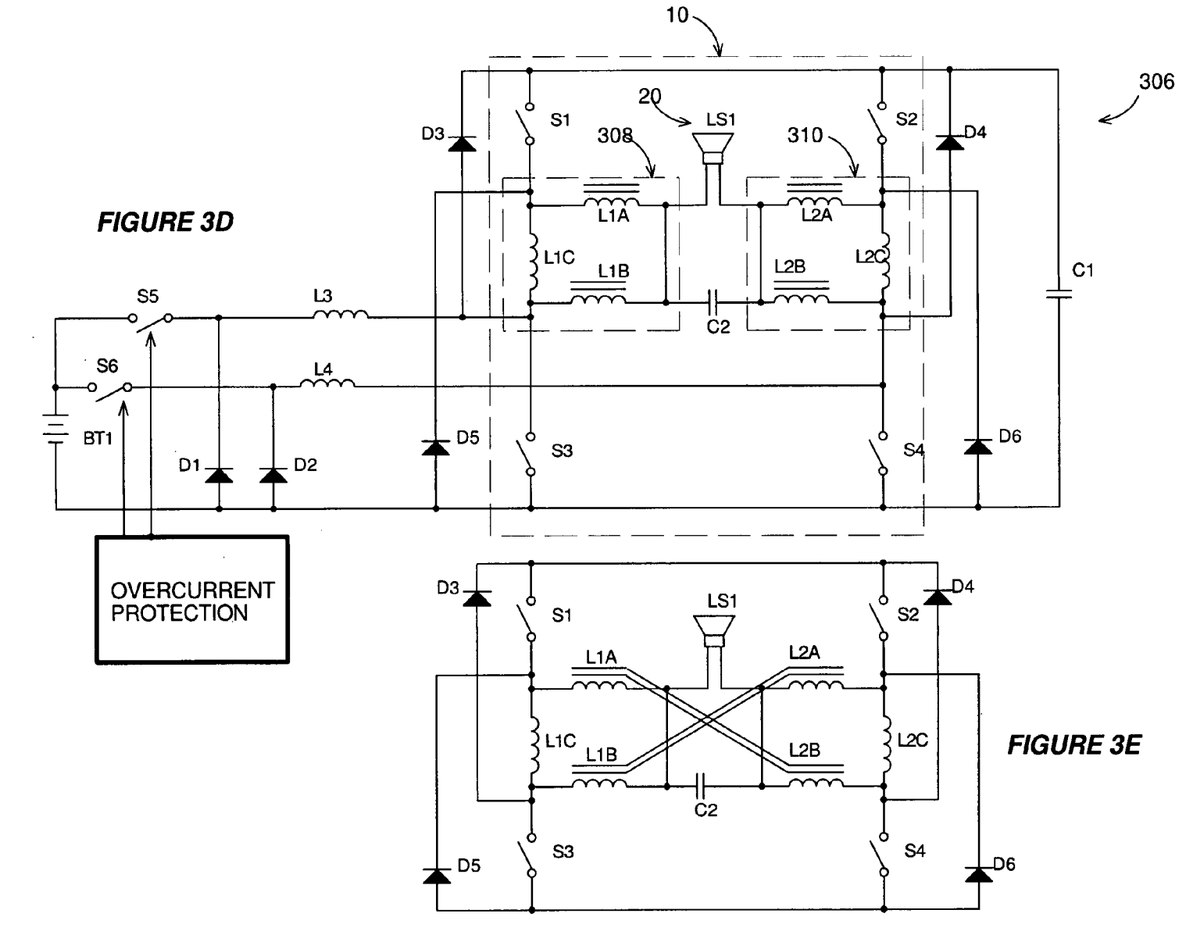
FIG. 3D is a schematic diagram of an exemplary amplifier with two sets of delta-configured inductors.
FIG. 3E is a schematic diagram of another embodiment of the amplifier shown in FIG. 3D.

FIG. 3D is a schematic diagram of an exemplary amplifier with two sets of delta-configured inductors. Amplifier 306 of FIG. 3D is essentially the amplifier of FIG. 3A with additional one-way valves D3-D6 and two sets of delta-configured inductors 308 and 310 in place of two inductors L1 and L2, respectively, shown in FIG. 3A. As shown in FIG. 3D, amplifier 306 includes H-bridge 10 that includes two sets of delta-configured inductors 308 and 310. First set of delta-configured inductors 308 includes inductors L1A, L1B, and L1C, and second set of delta-configured inductors 310 includes inductors L2A, L2B, and L2C. Inductors L1A and L1B associated with first set of delta-configured inductors 308 may be coupled to inductors L2A and L2B associated with second set of delta-configured inductors 310.

Sets of delta-configured inductors 308 and 310 connect switches S1-S4 to load 20 and one-way valves D3-D6 provide transient current paths to the switches. Sets of delta-configured inductors 308 and 310 and switches S1-S4 may be included to smooth the load current and to limit shoot-through current due to overlapping conduction of pairs of top switches S1 and S2 and bottom switches S3 and S4. FIG. 3D also shows three power converters having two bottom switches S3 and S4 in double duty as part of H bridge 10 and as main switches for two interleaved boost converters L3, D3, S3, and C1 and L4, D4, S4, and C1. It should be appreciated that sets of delta-configured inductors 308 and 310 may be part of H-bridge 10 or, as will be explained in more detail below, part of a half H-bridge.

FIG. 3E is a schematic diagram of another embodiment of the amplifier shown in FIG. 3D. As shown in FIG. 3D, when H-bridge 10 operates in binary mode, the currents in inductors L1A and L2B are the same. Similarly, the current in inductors L1B and L2A are the same. Therefore, as shown in FIG. 3E, inductors L1A and L2B may be coupled together and L1B and L2A also may be coupled together. In other words, L1A and L2B may be a coupled inductor and L1B and L2A also may be a coupled inductor. In one embodiment, a magnetic coupling may be used to couple L1A and L2B or to couple L2A and L1B. Inductor L1C has a smaller value than inductors L1A and L1B. Accordingly, inductor L1C may serve as a shoot-through current limiter when switches S1 and S3 have overlapping conduction during switching. Further, inductor L1C can also act as a current sharing connection between inductors L1A and L1B. Likewise, inductor L2C can limit the shoot-through current of switches S2 and S4 and can act as a current sharing connection between L2A and L2B.

Figure 4:
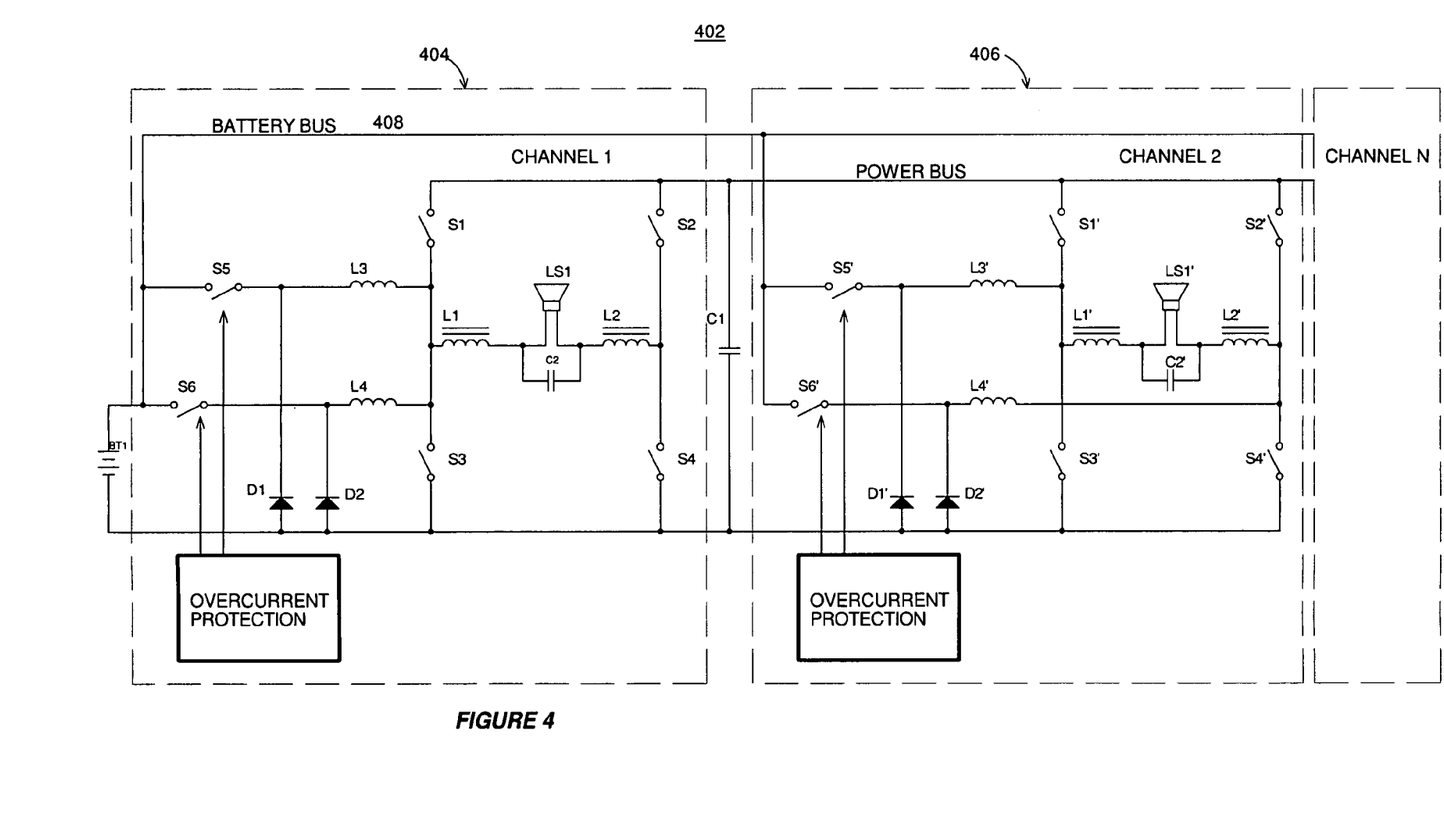
FIG. 4 is a schematic diagram of an exemplary amplifier system with amplifiers connected in parallel.

FIG. 4 is a schematic diagram of an exemplary amplifier system with amplifiers connected in parallel. As shown in FIG. 4, amplifier system 402 includes two amplifiers 404 and 406 connected in parallel that share power source BT1, battery bus 408, and capacitor C1. It should be appreciated that each amplifier 404 or 406 includes inductors L3 and L4 or L3' or L4' coupled to an H-bridge that are configured as boost converters. The coupling of two or more amplifiers, such as amplifiers 404 and 406, in parallel can reduce the storage capacitance of capacitor C1 because each amplifier acts as two current sources charging the capacitor. The ripple current in capacitor C1 associated with multiple amplifiers in parallel, such as amplifiers 404 and 406, may be lower than the ripple current of a capacitor associated with a single amplifier by a factor of about the number of parallel amplifiers. The size of capacitor C1 can therefore be reduced by the number of amplifiers, such as amplifiers 404 and 406. Additionally, a more steady voltage may result from charging capacitor C1 from multiple current sources.

Figure 5:
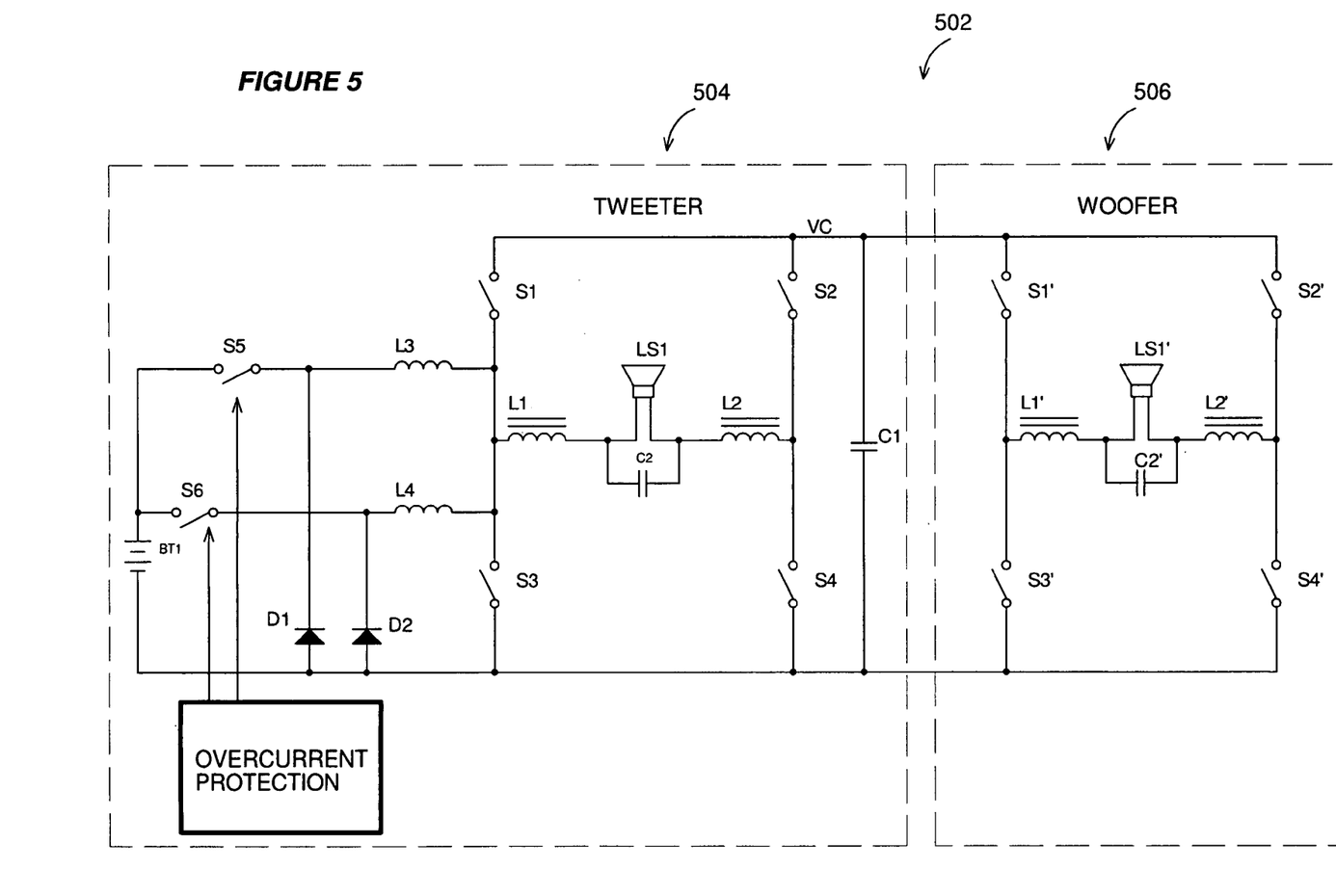
FIG. 5 is a schematic diagram of another exemplary amplifier system with a power source powering two amplifiers.

FIG. 5 is a schematic diagram of another exemplary amplifier system with power source powering two amplifiers. As shown in FIG. 5, amplifier system 502 includes amplifier 504 coupled to amplifier 506. Here, amplifier 504 includes inductors L3 and L4, power source BT1, H-bridge with switches S1-S4, and capacitor C1. Amplifier 506 includes H-bridge with switches S1'-S4'. In this embodiment, voltage VC of capacitor C1 is maintained on the average of about twice the voltage of power source BT1 by the virtue of the operation of boost converters L3, S1, S3, and C1 and L4, S2, S4, and C1 embedded in amplifier 504. As a result, additional channels of switch-mode amplifiers, such as amplifier 506, or linear amplifiers can be added to operate from the doubled voltage VC available on capacitor C1. In other words, capacitor C1 associated with amplifier 504 may be configured to power other amplifiers, such as amplifier 506. Specifically, boost converters L3, S1, S3, and C1 and L4, S2, S4, and C1 can automatically adapt current levels to maintain the voltage VC of capacitor C1 at about twice the voltage of power source BT1, minus all the voltage drops due to non-null resistances of components carrying the currents to the capacitor, such that about four time maximum powers can be possible from aggregated additional amplifiers, such as amplifier 506. An exemplary application of amplifier system 502 is to use amplifier 504 to power a tweeter and to use amplifier 506 to power a woofer.

It should be appreciated that audio signals can have a high crest factor, up to fifteen, with low root mean square (RMS) value. Thus, the duty cycle of boost converters L3, S1, S3, and C1 and L4, S2, S4, and C1 stay close to about 50%. Any large swing of the duty cycle of boost converters L3, S1, S3, and C1 and L4, S2, S4, and C1 due to the instantaneous amplitude of the audio signal can insignificantly change the currents in inductors L3 and L4, even in the case of a sine wave audio signal, if the value of the inductance of inductors L3 and L4 is high enough because the rates of change of the inductor currents are determined by the ratio of the average voltage across the inductors to the inductance of the inductors. The currents in inductors L3 and L4 may change the inductance values of the inductors are high because the rates of change of the inductor currents are determined by the ratio of the average voltage across the inductors to the inductance of the inductors. Thus, if the frequencies in the spectrum of the audio signal are higher than the corner frequency of boost converters L3, S1, S3, and C1 and L4, S2, S4, and C1, which is equal to $1/(2*\pi*\text{inductance } L*C1)$, the sum of the currents in the windings of inductors L3 and L4 is constant. Indeed, inductors L3 and L4, which as mentioned above can be coupled inductors, act as an effective EMI filter that attenuates all audio signals from H-bridge associated with amplifier 504 and also all the radio frequency voltages. The operation of boost converters L3, S1, S3, and C1 and L4, S2, S4, and C1 shows a ripple current cancellation effect in their summed currents which make up the current of power source BT1.

Figure 6:
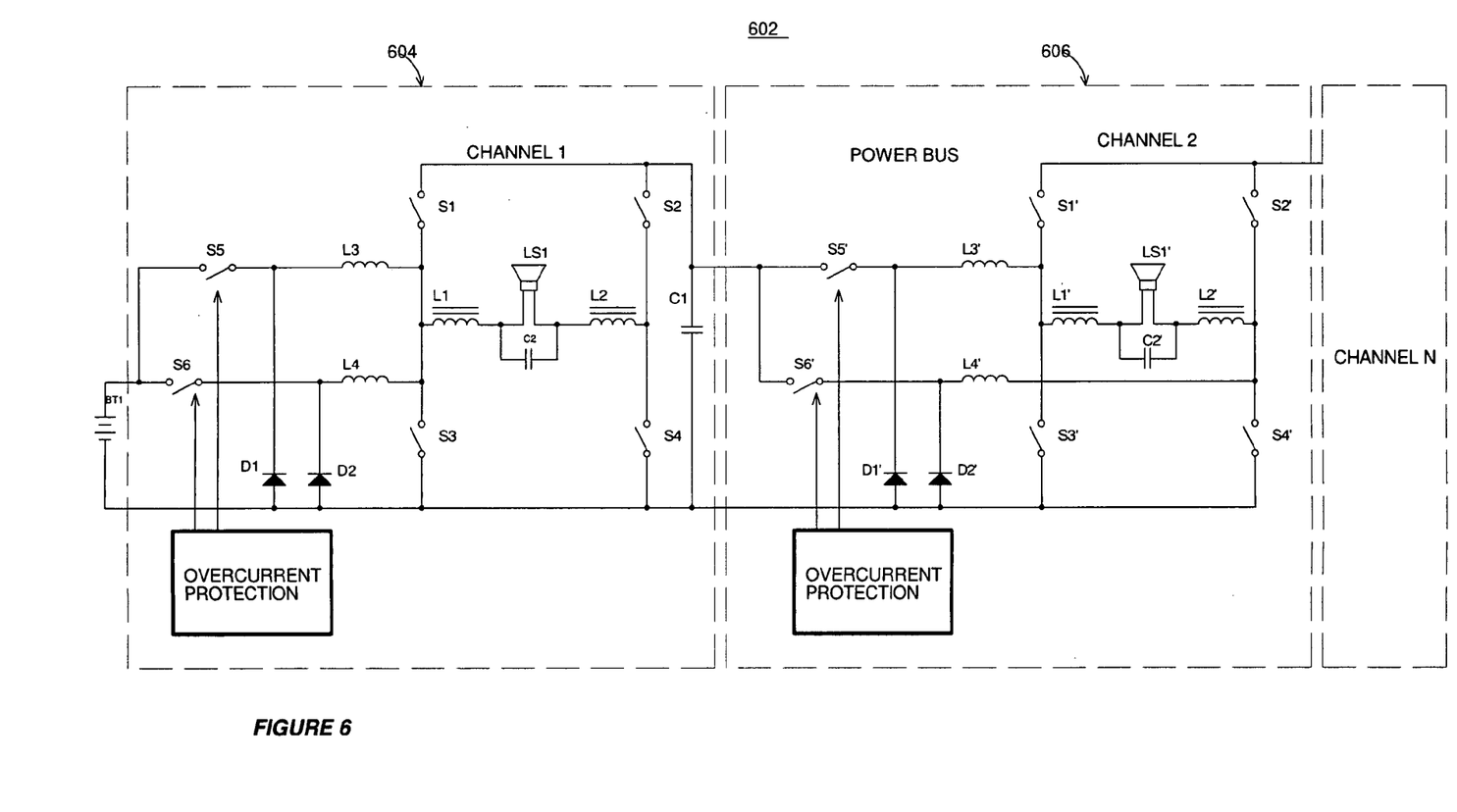
FIG. 6 is a schematic diagram of an exemplary amplifier system with cascaded amplifiers.

FIG. 6 is a schematic diagram of an exemplary amplifier system with cascaded amplifiers. As shown in FIG. 6, amplifier system 602 includes two cascaded amplifiers 604 and 606. Each amplifier 604 or 606 is essentially the amplifier shown in FIG. 3A where amplifier 604 is cascaded with amplifier 606. Here, amplifier 606 is connected to amplifier 604 across capacitor C1. Accordingly, the voltage of capacitor C1' is about double the voltage of capacitor C1. In other words, the voltage associated with capacitor C1 is about double a voltage of power source BT1 and the voltage associated with the capacitor C1' is about quadruple the voltage of the power source.

As a result, if loudspeaker LS1' associated with amplifier 606 has the same impedance as loudspeaker LS1 associated with amplifier 604, amplifier 606 can drive loudspeaker LS1' at a maximum power that is about four times the maximum power of amplifier 604. When peak power is considered, amplifier 606 can produce about four times more peak power than the peak power of amplifier 604. Meanwhile, the double amplitudes of high frequencies generated by amplifier 606 are attenuated by inductors L3' and 'L4' and also by inductors L3 and L4 and capacitor C1. Cascading of amplifiers 604 and 606 therefore provides about four fold output power capabilities for amplifier 604 and about sixteen fold output power capability for amplifier 606. Additionally, cascading of amplifiers 604 and 606 also increases the attenuation of high frequencies generated by the amplifiers. In term of decibels, the EMI attenuation is about doubled if inductors L3, L4, L3', and L4' are designed to provide the same attenuation of high frequencies in decibels.

It should be appreciated that by combining a number of amplifiers, such as amplifiers 604 and 606, in parallel and/or in cascade, any maximum output power can be provided to the loudspeakers, such as loudspeakers LS1 and LS1', for a given power source voltage and a given loudspeaker impedance. For example, in one embodiment, multiple amplifiers can be connected in parallel to share a power source and can additionally be cascaded off shared storage capacitors that are in parallel. In another example, a maximum output power can be provided for a subwoofer, medium power can be provided for a mid-range loudspeaker, and low power can be provided for tweeters. Additionally, the size of capacitors, such as capacitors C1 and C1', or their total capacitance can be reduced to lower than the capacitance of a single amplifier.

An exemplary application is the inclusion of an amplifier system, such as amplifier system 602 shown in FIG. 6 and amplifier system 402 shown in FIG. 4, in a 5.1, 7.1, or 8.1 surround sound system. The full-range channels can be implemented by connecting amplifiers in parallel with a small shared capacitor, such as capacitor C1 of FIG. 4, which in turn supplies a cascaded amplifier with quadrupled maximum power to drive a subwoofer.

Another exemplary application is the inclusion of a cascaded amplifier system, such as amplifier system 602 shown in FIG. 6, in car audio systems and in dual power systems with both AC and DC power inputs. Low DC voltage, such as twelve volts, associated with car audio systems is no longer an obstacle to high power because cascaded amplifiers, such as amplifiers 604 and 606, can supply high power. It should be appreciated that reserve power can result in better reproduction of high crest-factor audio signals and reserve power comes from higher supply voltages to the amplifiers, which can be supplied by cascaded amplifiers.

Figure 7A:
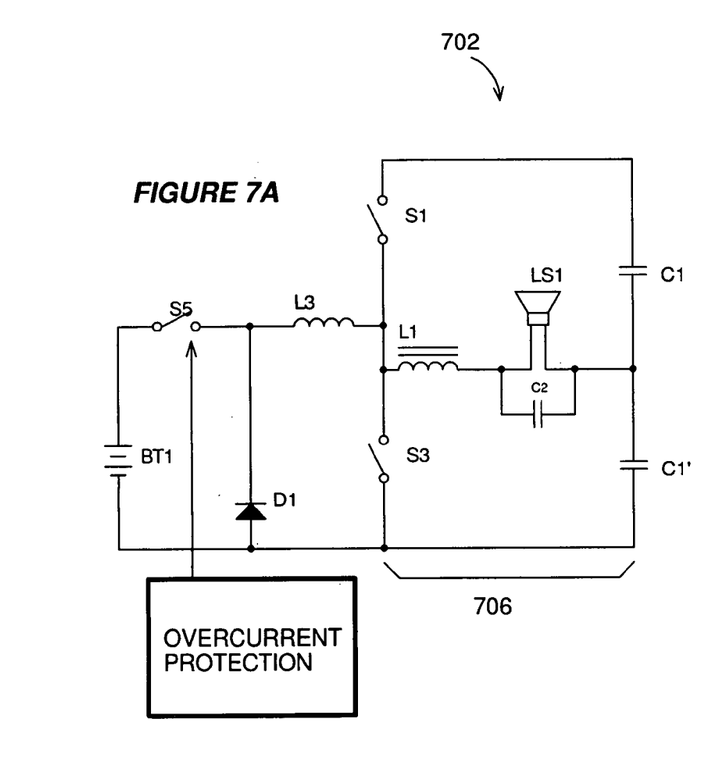
FIG. 7A is a schematic diagram of an exemplary amplifier with a half H-bridge.
Figure 7B:
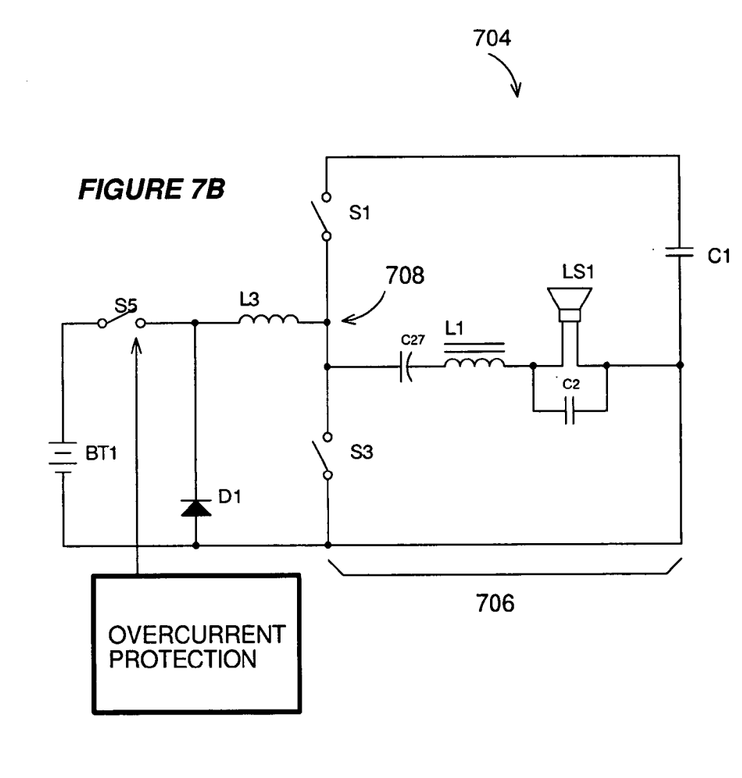
FIG. 7B is a schematic diagram of another embodiment of the amplifier shown in FIG. 7A.

FIG. 7A is a schematic diagram of an exemplary amplifier with a half H-bridge. As shown in FIG. 7A, amplifier 702 includes half H-bridge 706 which is formed from switches S1 and S3, capacitors C1 and C1', inductor L3, power source BT1, switch S5, and one-way valve D1. Inductor L3, half H-bridge 706, and capacitor C1 are configured as a boost converter. In another embodiment, as shown in FIG. 7B, amplifier 704 may include capacitor C27 between L1 and node 708. It should be appreciated that all possible configurations (e.g., cascading, connection in parallel, over-current protection, replacing inductor L1 with a set of delta-configured inductors to limit shoot-through current, and other configurations) discussed above associated with H-bridges can be applied to half H-bridge 706.

Figure 8:
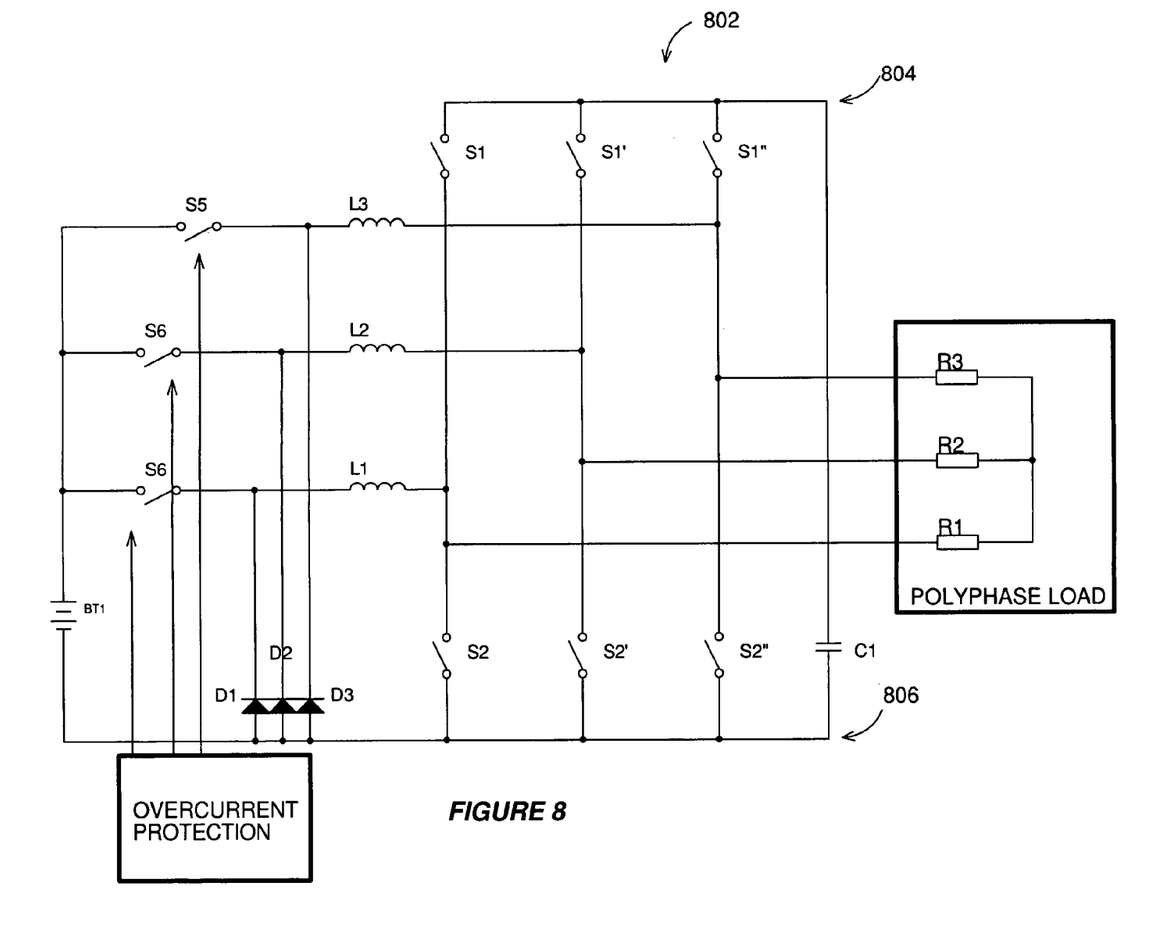
FIG. 8 is a schematic diagram of an exemplary polyphase booster inverter.

FIG. 8 is a schematic diagram of an exemplary polyphase booster inverter. The principle of embedding boost converters in amplifiers can also be extended to polyphase boost inverters. As shown in FIG. 8, three-phase inverter 802 includes six switches S1, S2, S1', S2', S1", and S2" coupled between positive rail 804 and negative rail 806 associated with the three-phase inverter. Additionally included is capacitor C1 coupled between positive rail 804 and negative rail 806. Inductors L1, L2, and L3 are coupled to pairs of switches S1 and S2, S1' and S2', and S1" and S2", respectively, at the junctions of the pairs of switches. Inductor L1, switches S1 and S2, and capacitor C1 are configured as a boost converter that provides about double the voltage of power source BT1 to switches S1, S2, S1', S2', S1", and S2". Similarly, inductors L2 and L3, switches S1', S2', S1", and S2", and capacitor C1 are configured as two boost converters. It should be appreciated that the embedded boost converters can be implemented into inverters of any suitable number of phases. For example, six boost converters may be embedded into an inverter with twelve switches configured as six half-bridges. Similar to the embodiments discussed in FIG. 3A, in one embodiment, currents associated with inductors L1-L3 may be limited by series-connected bang-bang-controlled switches, where bang-bang control is a method of ON/OFF control to keep an object variable within two limits. It should be appreciated that three-phase inverter 802 may include a modulator for controlling the switching of switches S1, S2, S1', S2', S1", and S2" based on a reference signal to generate polyphase AC voltages.

In summary, the above-described embodiments provide amplifiers and inverters with one or more embedded boost converters. The inductors that comprise the boost converters are inexpensive and small, and with two boost converters, the source current is virtually constant. With the embedded boost converter, an integrated booster amplifier does not need a DC-to-DC step-up converter, therefore reducing costs. In addition, one amplifier with embedded boost converters may be sufficient to supply double voltage to a capacitor, which can power additional amplifiers. Furthermore, cascading any number of amplifiers with embedded boost converters provides very high power output from a low power source voltage, such as twelve volt battery voltage, while driving loudspeakers with impedances such as four ohms and eight ohms.

Although the foregoing embodiments have been described in some detail for purposes of clarity of understanding, implementations of the above-described system and techniques is not limited to the details provided. There are many alternative implementations and the disclosed embodiments are illustrative and not restrictive.

What is claimed is:

1. An amplifier, comprising:
   an H-bridge that comprises a first switch, a second switch, a third switch, and a fourth switch;
   a capacitor coupled to the H-bridge;
   a first inductor coupled to the H-bridge, wherein the first inductor, the first and second switches, and the capacitor are configured as a first boost converter;
   a second inductor coupled to the H-Bridge, wherein the second inductor, the third and fourth switches, and the capacitor are configured as a second boost converter;
   a first set of delta-configured inductors coupled to the first and second switches; and
   a second set of delta-configured inductors coupled to the first set of delta-coupled inductors and the third and fourth switches.

2. The amplifier of claim 1, wherein the H-bridge further comprises:
   a first magnetic coupling that couples the first and second set of delta-configured inductors; and
   a second magnetic coupling that couples the first and second set of delta-configured inductors.

3. An amplifier, comprising:
   a half H-bridge that comprises a first switch, a second switch, and a set of delta-configured inductors, the set of delta-configured inductors being coupled to the first and second switches;
   a capacitor coupled to the half H-bridge; and
   an inductor coupled to the half H-bridge, the inductor, the first and second switches, and the capacitor being configured as a boost converter.

* * * * *